(12) United States Patent
Jaussi et al.

(10) Patent No.: US 7,145,373 B2
(45) Date of Patent: Dec. 5, 2006

(54) FREQUENCY-CONTROLLED DLL BIAS

(75) Inventors: James E. Jaussi, Hillsboro, OR (US);
Randy R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 111 days.

(21) Appl. No.: 10/901,398

(22) Filed: Jul. 29, 2004

(65) Prior Publication Data
US 2006/0022728 A1 Feb. 2, 2006

(51) Int. Cl.
*H03L 7/06* (2006.01)
(52) U.S. Cl. .................. 327/158; 327/50; 327/162
(58) Field of Classification Search ............. 327/147, 327/149, 150, 156, 158, 159, 161, 162, 50–52, 327/63, 77, 306, 309, 331, 332
See application file for complete search history.

(56) References Cited

U.S. PATENT DOCUMENTS

| | | | | | |
|---|---|---|---|---|---|
| 4,929,849 | A | * | 5/1990 | Paul | 327/155 |
| 5,696,468 | A | * | 12/1997 | Nise | 331/14 |
| 5,703,540 | A | * | 12/1997 | Gazda et al. | 331/16 |
| 5,767,748 | A | * | 6/1998 | Nakao | 331/57 |
| 5,982,836 | A | * | 11/1999 | Sakae et al. | 375/376 |
| 5,986,485 | A | * | 11/1999 | O'Sullivan | 327/156 |
| 5,986,514 | A | * | 11/1999 | Salvi et al. | 331/17 |
| 6,150,858 | A | * | 11/2000 | Sung | 327/156 |
| 6,163,224 | A | * | 12/2000 | Araki et al. | 331/34 |
| 6,329,883 | B1 | * | 12/2001 | Pacourek | 331/17 |
| 6,353,368 | B1 | * | 3/2002 | Iravani | 331/57 |
| 6,501,317 | B1 | * | 12/2002 | Lin et al. | 327/287 |
| 6,668,266 | B1 | * | 12/2003 | Kiuchi et al. | 708/490 |
| 6,804,074 | B1 | * | 10/2004 | Shoji et al. | 360/51 |
| 6,952,124 | B1 | * | 10/2005 | Pham | 327/156 |

OTHER PUBLICATIONS

D.A. Johns and K. Martin, Analog Integrated Circuit Design, pp. 21-25 (1997).

* cited by examiner

*Primary Examiner*—Timothy P. Callahan
*Assistant Examiner*—Hai L. Nguyen
(74) *Attorney, Agent, or Firm*—Fleshner & Kim LLP

(57) ABSTRACT

A system for controlling bias of a delay-locked loop includes a peak detector and a comparator in the form of a differential amplifier. The peak detector detects the amplitude of a signal output from the DLL, and the comparator compares the DLL output signal amplitude to a reference signal. The comparator then generates a tail current control signal for the DLL based on a result of the comparison. In one embodiment, the reference signal is indicative of a predetermined tail current value for the DLL, and the tail current control signal adjusts delay of the DLL to equal the predetermined tail current value. Preferably, the tail current control signal maintains the DLL signal output at a substantially constant amplitude in spite of frequency variations and may also be used to set the voltage swing for the DLL.

34 Claims, 8 Drawing Sheets

FREQUENCY-CONTROLLED DLL BIAS

FIELD

This invention generally relates to circuits for generating frequency signals including but not limited to clock signals.

BACKGROUND OF THE INVENTION

Synchronous sequential systems rely on globally synchronized clocks. A delay-locked loop (DLL) is one type of circuit capable of generating these clocks. DLLs have proven advantageous because of their ability to achieve low clock skew distributions. They are also suitable for use in high-speed circuits that require clock signals with programmable duty cycles and delay.

In spite of their advantages, many DLL circuits demonstrate an unsatisfactory level of stability control. For example, in these circuits tail current used to control the delay cells is maintained at a constant value. As a result, frequency variations translate into proportional changes in the DLL output amplitude. This situation, shown in FIG. 1, has proven to be undesirable for many high-speed applications.

DESCRIPTION OF THE PREFERRED EMBODIMENTS

Figure 2:
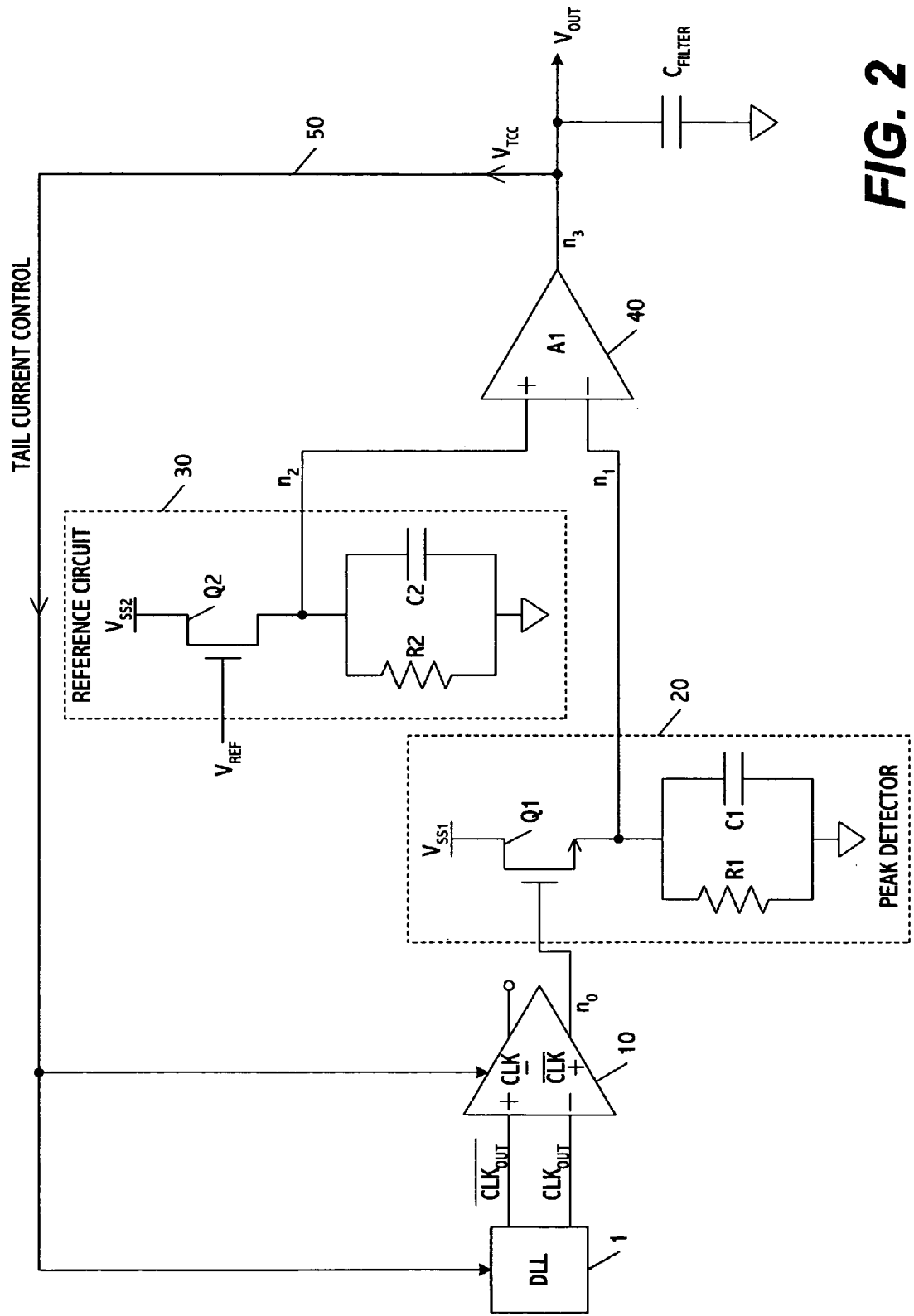
FIG. 2 is a diagram showing a DLL control circuit in accordance with one embodiment of the present invention.

FIG. 2 shows a circuit for controlling a delay-locked loop circuit 1 in accordance with one embodiment of the present invention. The circuit includes a delay cell 10, a detector 20, a reference signal generator 30, and a comparator 40. An optional filter may be included to remove unwanted components from the output of the comparator. This may prove to be especially advantageous when the comparator is implemented as a differential amplifier, where the output not only corresponds to a tail current control signal but also to a delayed output frequency signal of the delay-locked loop. The filter may be implemented in the form of a capacitor $C_{filter}$ or another circuit.

The delay cell is coupled to the DLL circuit through a pair of differential input terminals, e.g., clock signal $clk_{out}$ is coupled to the inverting terminal and its complement $\overline{clk}_{out}$ is coupled to the non-inverting terminal of the delay cell. The delay cell operates to delay these differential output clock signals by a predetermined time. Preferably, delay cell 10 has a same structure as the one or more delay cells that form the delay-locked loop circuit. In an alternative embodiment, these cells may differ.

The detector is coupled to receive at least one of the delayed clock signals from delay cell 10. In FIG. 2, the detector receives the complement of the delayed clock signal $\overline{clk}$ from the non-inverting terminal of the delay cell. The amplitude of the delayed clock signal is then detected and output to circuit 40 for comparison to a reference signal. In an alternative embodiment, the delayed clock clk from the inverting terminal may be input into the detector.

The reference signal generator outputs a reference signal which corresponds to one or more control characteristics of the DLL circuit. Preferably, the reference signal is set to a value which corresponds to or otherwise defines an intended tail current of the DLL. This value may also set a voltage swing for the delay cell output that meets the requirements of any one of a variety of intended applications.

The comparator circuit compares the amplitude signal from the detector to the reference signal, and then generates a control signal based on the result. The comparator circuit may be, for example, a differential amplifier (A1) having a non-inverting terminal coupled to receive the reference signal and an inverting terminal coupled to receive the amplitude signal. The differential amplifier amplifies the difference, if any, between the amplitude and reference signals by a predetermined gain. The resulting control signal ($V_{TCC}$) is then output along a feedback path 50 to adjust the delay cell(s) in the delay-locked loop circuit and preferably also the tail current of delay cell 10. Some of the ways in which the tail current may be adjusted are described in greater detail below.

One non-limiting example of the amplitude (or peak) detector is shown in FIG. 2. This detector includes a transistor Q1 coupled between a power supply $V_{SS1}$ and an RC circuit formed from resistor R1 and capacitor C1. These elements cooperate to track the peak value of the delayed clock signal output from delay cell 10. More specifically, when a positive voltage is input into one of the input terminals (e.g., the inverting terminal) of the delay cell, delayed clock signal $\overline{clk}_{out}$ switches on transistor Q1. As a result, capacitor C1 charges to a voltage equal to the peak value of n0−Vt of transistor Q1, which corresponds to an initial peak value and where n0 corresponds to the voltage of the delayed clock signal $\overline{clk}_{out}$.

In one non-limiting implementation, the peak value of $\overline{clk}_{out}$ and $V_{ref}$ equal $V_{SS2}/2$, and the drains of Q1 and Q2 are connected to $V_{SS1}=V_{SS2}$ so that the current to charge C1 and C2 derives from the supply and not Vref and the output of the delay cell. Vref and the delay cell may drive a capacitive load. C2 is initially charged to Vref−Vt of transistor Q2.

When the amplitude of $\overline{clk}_{out}$ increases above the voltage stored in the capacitor, the capacitor charges up to the new value, denoting a new peak. Amplifier A1 compares the voltages of n1 and n2 where are equal to the peak of $\overline{clk}_{out}$−Vt and $V_{ref}$−Vt respectively. If the difference between n2 and n1 is negative, a tail current control signal $V_{TCC}$ is generated as a difference signal output from A1. This signal increases the tail current of the delay cell until A1 determines (the output of the differential amplifier shows) that n1=n2.

The voltage in the capacitor C1 gradually discharges through the resistor R1 allowing for dynamic changes in the output voltage of the delay cell. For example, if n1=n2 initially (and therefore n0 peak=$V_{ref}$) and if the input clock frequency decreases such that the peak value of n0 is greater than $V_{ref}$, then the tail current is decreased. If C1 is not discharged through R1, then the output of the amplifier would continue to change until the tail current completely turns off. Preferably, the discharge rate or pole due to 1/(R1*C1) is larger in magnitude than the pole due to $C_{filter}$ and the output impedance of A1. This will provide increased stability to the closed loop, thus preventing the delay cell from being completely turned off. In other words, $C_{filter}$ and the output of A1 may form the dominant closed-loop system pole. It is also preferable to have R2 such that $V_{ref}$ can be decreased to a new value and therefore the capacitor will discharge until n3=$V_{ref}$-$V_t$, where $V_t$ is the threshold voltage of the transistor.

Generally, but not necessarily, the value of n3 and n2 will be smaller than $V_{ref}$-$V_t$ and the peak of n0, respectively, due to the current that always discharges through C1 and C2, and preferably n2 /R1=I1. For Q1, the drain current is equal to I1=uCoxW/(2L)*$(V_{gs1}-V_t)^2$ (for a square law device), where μ is the device mobility, Cox is the gate capacitance per unit area, W is the with of the transistor, and L is the length of the transistor. Solving for $V_{gs1}$ will give a more accurate equation expressed by the peak of n0-$V_t$-$V_{gs1}$=n1.

The detector shown in FIG. 2 is just one type of circuit which may be used to perform amplitude detection of the delay cell output. In alternative embodiments, other peak or amplitude detection circuits may be used. The reference signal generator may be formed in a manner similar to the amplitude detector. For example, as shown in FIG. 2 the reference signal generator may include a transistor Q2 coupled between a power supply $V_{SS2}$ and an RC circuit formed from resistor R2 and capacitor C2. Also, $V_{SS1}$ may equal $V_{SS2}$ or these values may be different depending on the intended application. While this type of reference signal generator may be preferable, other signal generators may alternatively be used.

In operation, the control circuit of FIG. 2 detects a difference between the amplitude and reference signals and then generates a control signal $V_{TCC}$ to correct the tail current of the delay cell(s) in the delayed-lock loop circuit and delay cell 10, which preferably is a replica of one or more delay cells in the DLL. To improve performance of the delay-locked loop, control signal $V_{TCC}$ adjusts the tail current of the delay cells to ensure that the output of the DLL and delay cell 10 maintain a constant value (e.g., amplitude) throughout at least a predetermined bandwidth, e.g., throughout a predetermined range of frequencies that coincides with or falls within the operational frequency range of the DLL.

Figure 1:
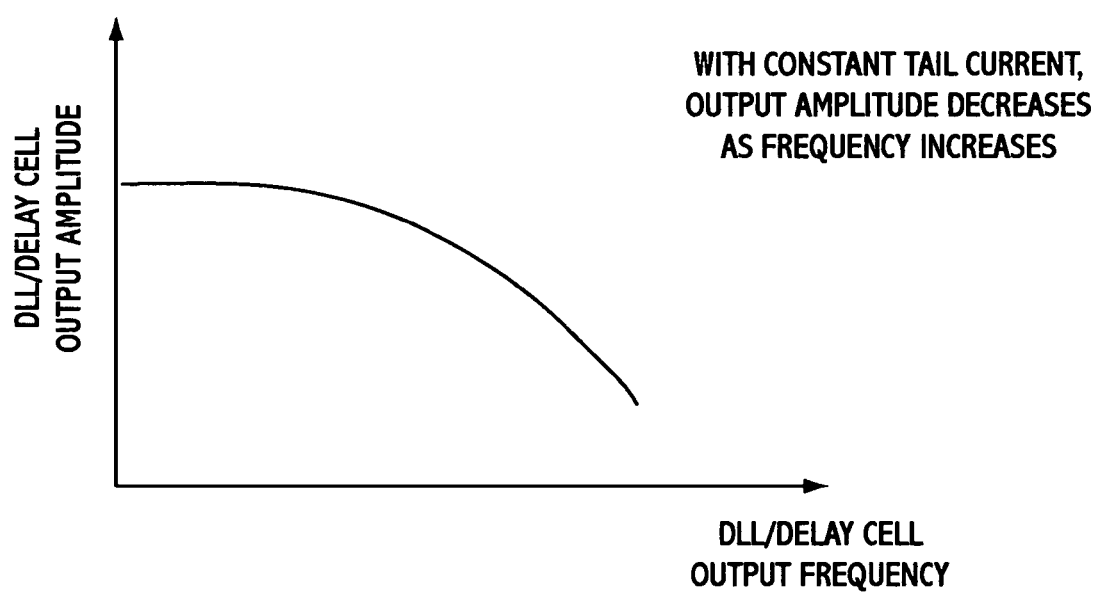
FIG. 1 is a graph showing how the output of many DLLs tend to vary with frequency when tail control current is maintained at a fixed value.

This may be accomplished by increasing the tail current of the delay cells through control signal $V_{TCC}$ when the amplitude of the delayed clock signal decreases. Because this amplitude is inversely proportional to the output frequency of the DLL (as shown by FIG. 1), increasing the tail current of the delay cells will reduce amplitude variation in the DLL output.

More specifically, the source synchronous clock is in an alternating pattern. In the present embodiment, the clock is differential and the magnitude of clk and $\overline{clk_{out}}$ have the same magnitude but differ in phase by 180°. This causes a new peak to be detected by the peak detector. An alternative embodiment may contemplate the use of a non-differential circuit design.

When the new peak is compared to the output of the reference signal generator, control signal $V_{TCC}$ changes to effect a proportional increase in the tail current to offset the rise in voltage in the output of the DLL and delay cell 10. Preferably, the tail current is increased by an amount which maintains at least a substantially constant amplitude in the DLL output with changes in frequency.

Conversely, the tail current may be decreased through control signal $V_{TCC}$ when the amplitude of the delayed clock signal increases. Because this amplitude is inversely proportional to the output frequency of the DLL (as shown in FIG. 1), increasing the tail current of the delay cells will reduce amplitude variation in the DLL output.

More specifically, the source synchronous clock is in an alternating pattern. In the present embodiment, the clock is differential and the magnitude of clk and $\overline{clk_{out}}$ have the same magnitude but differ in phase by 180°. For this reason, only one of the delay cell outputs may be compared to $V_{ref}$ because it is the amplitude information that is used. This causes a lower peak signal to be detected and output to the comparator. When compared to the signal output from the reference signal generator, control signal $V_{TCC}$ changes to effect a proportional decrease in the tail current to offset the fall in voltage in the output of the DLL and delay cell 10. Preferably, the tail current is decreased by an amount which maintains at least a substantially constant amplitude in the DLL output with changes in frequency.

Figure 3:
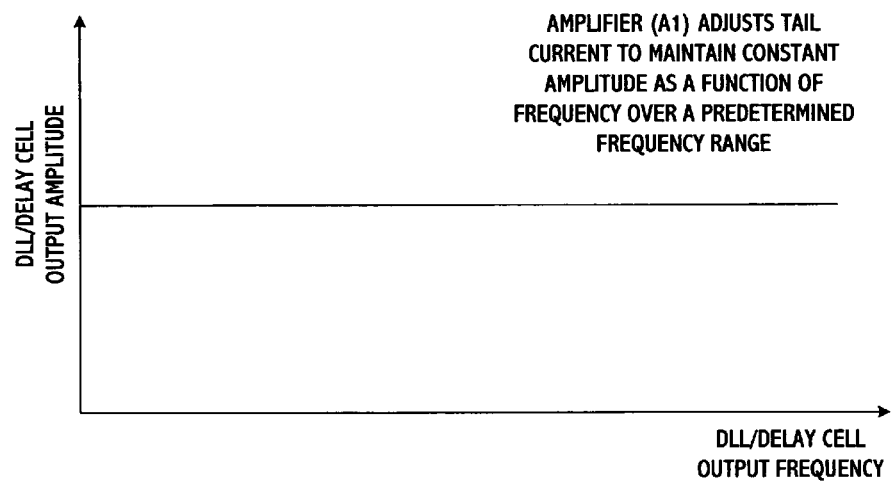
FIG. 3 is a graph showing how tail current control may be performed to render the output of a DLL independent of frequency variations in accordance with at least one embodiment of the present invention.

In either situation discussed above, changes in the peak voltage of the output clock signal clk may arise as a result of bandwidth limitations and other influences. By controlling the value of the tail current through $V_{TCC}$, the output of the DLL and delay cell 10 may be maintained at a constant value in spite of these bandwidth limitations and other influences. This is illustratively shown in FIG. 3, where the DLL and delay cell output amplitude is held constant as a function of frequency, e.g., over a predetermined range of frequencies.

Concerning bandwidth limitations and their affect on the amplitude of the output clock signal, it is noted that the bandwidth of the cell is determined by the impedance of the load (e.g., 216 and 218 in FIG. 8) and the capacitance of these devices and capacitance of the following stage. These devices form a pole (1/RC). As the input frequency increases, the peak amplitude my role off if operating near the bandwidth of the cell. By increasing the tail current, the value of R can be decreased and a larger swing can be obtained. If the devices following the DLL are sensitive to input amplitude, this auto swing control may be preferable for many applications.

Changing the tail current in the aforementioned manner results in adjusting the voltage swing of the DLL and delay cell as a function of frequency. This allows the DLL to achieve higher clock rates (and a commensurately greater operational bandwidth) without requiring external control voltages that other delayed-lock loop circuit require. The voltage swing of the DLL and delay cell may also be adjusted by setting the reference voltage $V_{Ref}$ into the reference signal generator to an intended value, as described in greater detail below.

Figure 4:
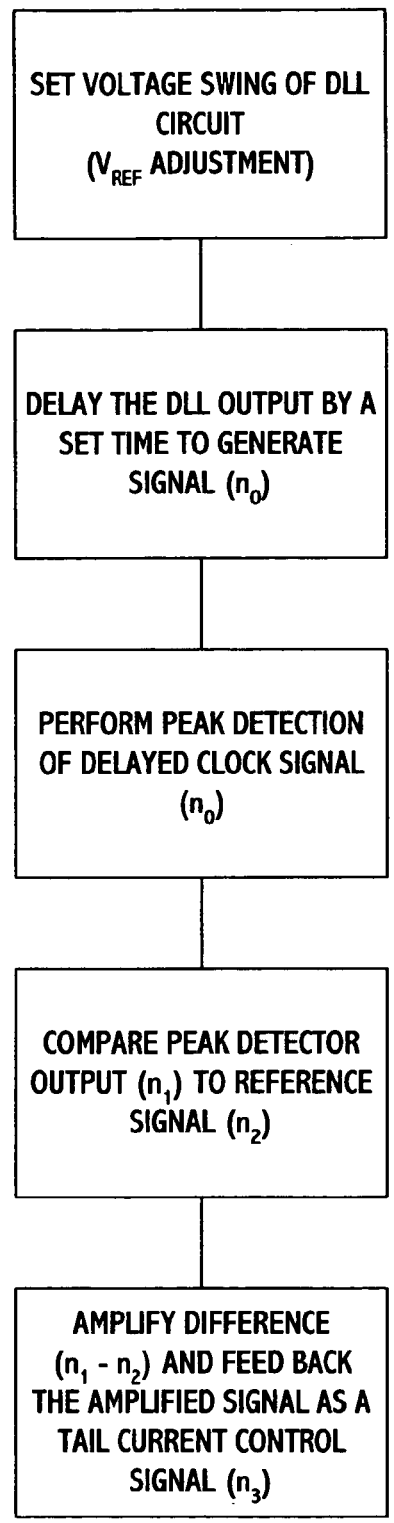
FIG. 4 is a flow diagram showing functional blocks included in a method for controlling a DLL in accordance with one embodiment of the present invention.

FIG. 4 is a flow diagram showing function blocks included in one embodiment of a method for controlling a delay-locked loop in accordance with the present invention. This method is preferably implemented using the circuit shown in FIG. 2, however other circuits may be used to perform one or more of the functional blocks. In an alternative embodiment, all or a portion of these blocks may be implemented in software.

Initially, the reference voltage $V_{Ref}$ of signal generator 30 is set or otherwise adjusted to a value suitable to meet an intended application. (Block 100). As explained, setting $V_{Ref}$ will adjust the voltage swing of the delay-locked loop and delay cell 10. (In one implementation, delay cell 10 may be included as one and preferably the last-stage cell in a chain of delay cells forming the delayed-lock loop. In other embodiments as shown in FIG. 2, the delay cell is externally coupled to the DLL cells).

Next, the output of the DLL is delayed by a predetermined time in delay cell 10. (Block 110). Preferably, this delay time of cell 10 is the same as that imposed by each delay cell forming the DLL circuit. These times may be different, however. The resulting delayed clock signal ($n_0$) is input into the peak detector.

The peak detector determines the peak amplitude of the delayed clock signal $n_0$ over time. (Block 120). The output signal of the peak generator ($n_1$) is then compared to the reference signal output ($n_2$) from the reference signal generator to determine whether any adjustment in stability of the DLL circuit is required. (Block 130).

If the peak detector signal ($n_1$) and reference signal ($n_2$) are different, a voltage $V_{TCC}$ corresponding to this difference is amplified in a differential amplifier (A1) and fed back to the DLL and delay cell 10 as a tail current control signal. (Block 140). This process is iteratively continued until the peak detector and reference signals equal one another.

Figure 5:
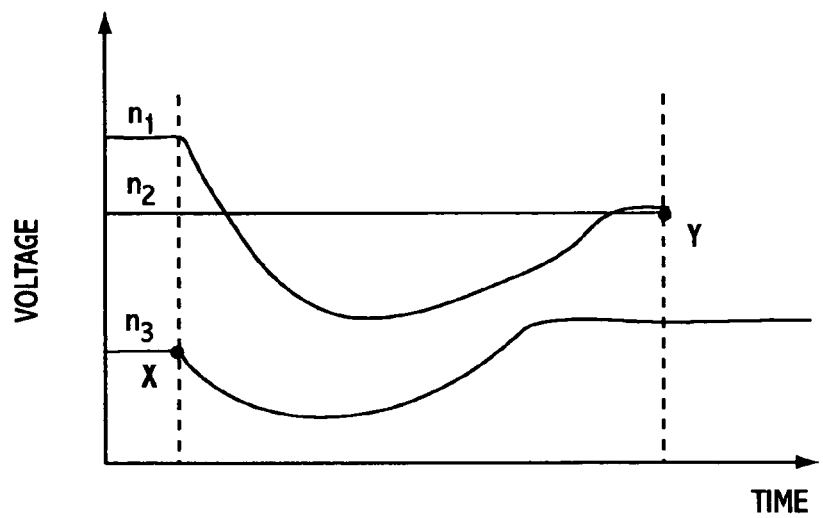
FIG. 5 is a graph showing how a tail current control signal maintains the output of a DLL at a constant level in spite of frequency variations.

FIG. 5 is a graph showing one possible effect of the tail current control signal. In this graph, an initial time is shown as a startup time but this relationship may just as well apply for other initial times. At startup, the value of peak detector signal $n_1$ is higher than signal $n_2$ output from the reference signal generator. Under these conditions, control signal ($n_3$) decreases at point X to effect a proportional decrease in the tail current of the DLL delay cells and delay cell 10. When $n_1$ becomes less than $n_2$, the tail current control signal $n_3$ output from the differential amplifier increases until the output of the peak detector and the reference signal at least substantially equal one another at point Y (e.g., until $n_1=n_2$), or at least until the peak detector output and reference signal fall within a certain range or have an intended relationship to one another. Throughout this process, the output of the peak detector follows changes in the tail control signal.

Figure 6:
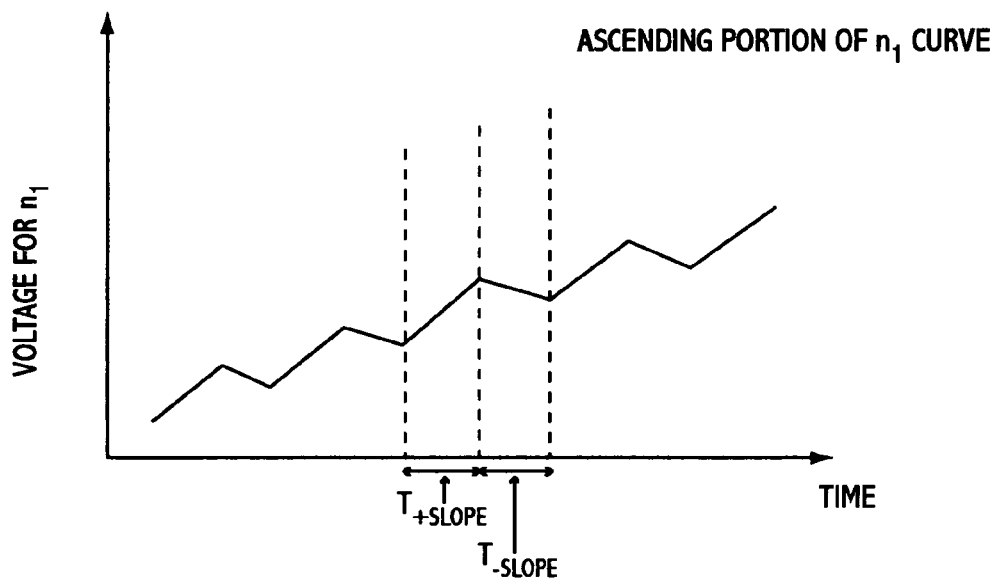
FIG. 6 is an exploded view of an ascending portion of a curve in the graph of FIG. 5.

FIG. 6 is an exploded view of how the tail current control signal corrects the peak detector voltage to equal the signal output from the reference signal generator. In this embodiment, the peak detector signal is corrected iteratively. Along an ascending portion of $n_1$, when $n_0 > n_1 - V_t$, power supply $V_{ssl}$ charges capacitor $C_1$ through transistor $Q_1$. The output of $n_1$ is shown to have a positive slope as long as this relationship exists, which for illustrative purposes is shown to correspond to time $T_{+slope}$. When $n_0 < n_1 - V_t$, the charge in capacitor $C_1$ discharges through resistor $R_1$. The output of $n_1$ is shown to have a negative slope as long as this relationship exists, which is illustratively shown to correspond to time $T_{-slope}$. The period of oscillation is shown to be a time span defined by or which otherwise includes $T_{+slope}$ and $T_{-slope}$. $V_t$ corresponds to the voltage drop across transistor $Q_1$, otherwise known as the threshold voltage.

One or more embodiments of the control circuit and method of the present invention may advantageously be used to stabilize or improve operation of a DLL circuit. For example, in many DLL circuits which have been proposed the tail current is maintained at a constant value. As a result, variations in the DLL output frequency will translate into proportional changes in the amplitude (or magnitude) of the DLL. This situation, shown in FIG. 1, has proven to produce at least the following undesirable effects including increased duty cycle error sensitivity, jitter transfer amplification, increase power supply sensitivity, and clock evaporation due to not meeting the required input voltage swing value of following clock circuits.

In order to overcome all or a portion of these effects and/or to achieve other advantages or performance objectives, the control circuit and method of the aforementioned embodiments may be used in one illustrative application to stabilize the output of the DLL. More specifically, by generating a control signal $V_{TCC}$ that adjusts the tail current of the delay cells to offset variations in the output frequency of the DLL, the amplitude/magnitude of the DLL output may be maintained at a constant value at least throughout an intended bandwidth. This may be achieved, at least in part, by selecting a reference value $V_{Ref}$ which sets (or otherwise increases) the voltage swing of the delay cell output to the required voltage amplitude of the circuit following the DLL.

Figure 7:
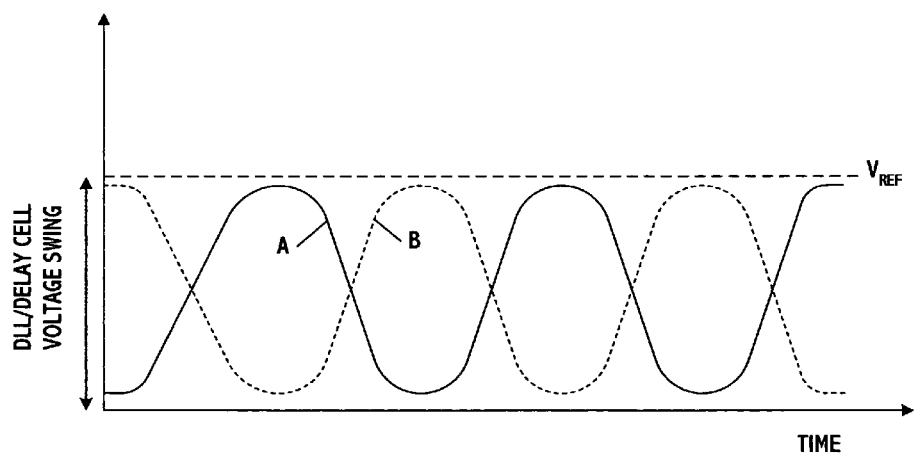
FIG. 7 is a graph showing how voltage swing of a DLL may be controlled in accordance with at least one embodiment of the present invention.

FIG. 7 illustratively shows this situation, where Curve A corresponds to the output of the delay cell(s) in the DLL and delay cell 10 and Curve B corresponds to its differential complement. In referencing this figure, it is noted that voltage swing is affected by or otherwise related to the tail current in terms of maximum swing height (e.g., I*R where R is set by 216 and 218). Also, voltage swing is affected by or otherwise related to the DLL output frequency by the equation 1/CR, and to the DLL output amplitude by both I*R and 1/CR and the frequency of operation. Given these relationships, the voltage swing may be set or adjusted by setting the value of $V_{ref}$. For example, half the supply voltage may be used as a basis for providing the differential swing, e.g., $V_{ref}=V_{ss}/2$. Under these conditions, sufficient flexibility is provided for the tail current devices.

Depending on the objectives of the intended application, maintaining a constant-amplitude output from the DLL in spite of frequency variations can increase duty cycle error sensitivity, improve jitter transfer amplification, increase power supply sensitivity, and/or improve clock evaporation due to not meeting a required input voltage swing value of following clock circuits.

Figure 8:
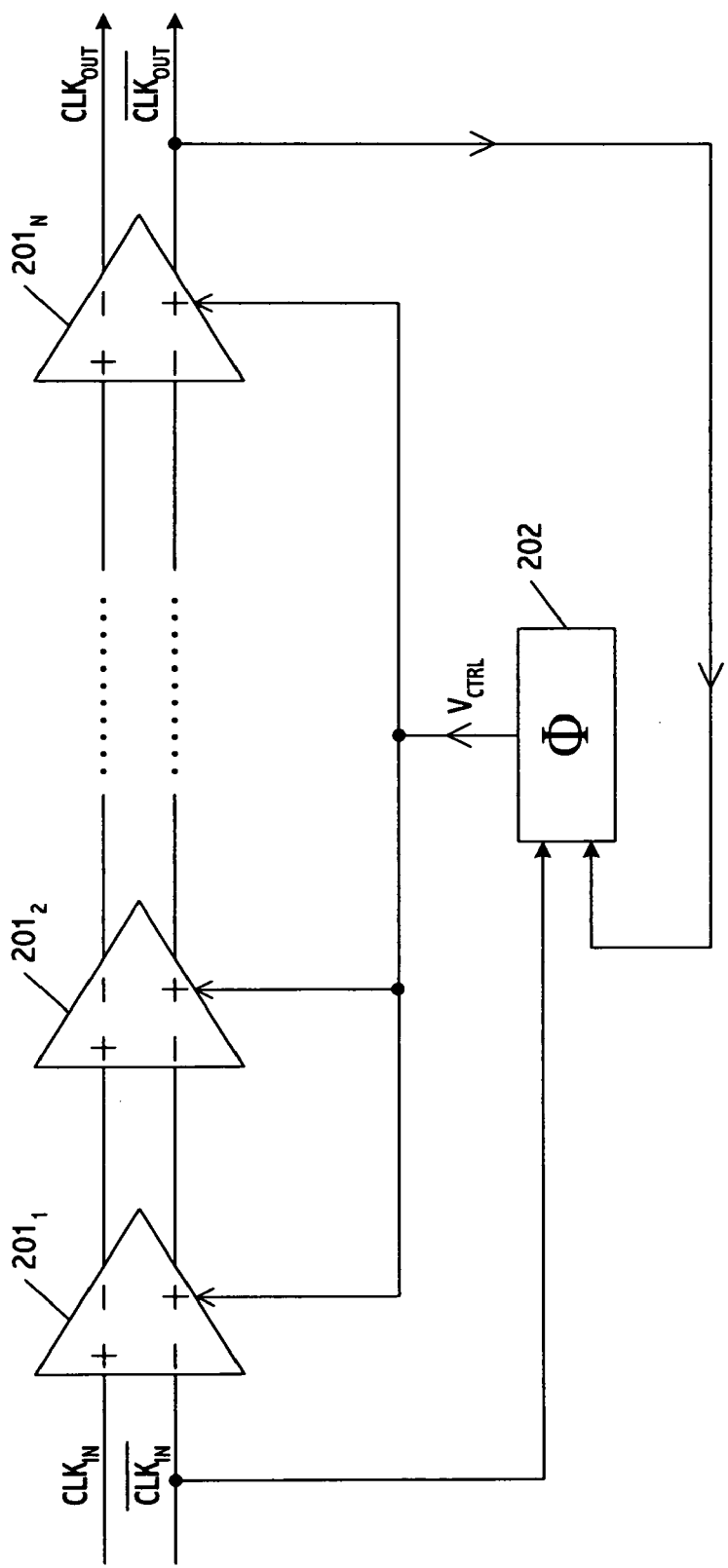
FIG. 8 is a diagram showing one type of DLL that may be used in accordance with one or more embodiments of the present invention.

FIG. 8 shows one way in which the delayed-lock loop may be formed in accordance with one or more of the embodiments of the present invention. This DLL includes a number of delay cells $201_1$ though $201_N$ and a phase detector (Φ) 202 which generates a control signal for controlling delay of each of the delay cells. While three delay cells are shown, the DLL may be formed from only one delay cell or as many as N cells, where N is a number greater than one. Moreover, each delay cell may impose an equal amount of delay through the chain, or one or more of these delays may be different. Also, cells in the chain may be selectively activated to generate a delayed clock signal having an intended delayed time. The total delay time through the chain may be set to achieve the requirements of an intended application.

The phase detector controls the delay through each delay cell by locking the delay though each cell to the incoming clock. This may be accomplished, for example, by setting the delay of each cell using control voltage $V_{ctrl}$. When four delay cells (N=4) are used, locking the 0 degree phase to the 180 degree phase yields 45 degree phase for each cell. Thus, for example, $V_{ctrl}$ may be used to set the resistance value R of the transistors 216 and 218, which are discussed in greater detail below.

Figure 9:
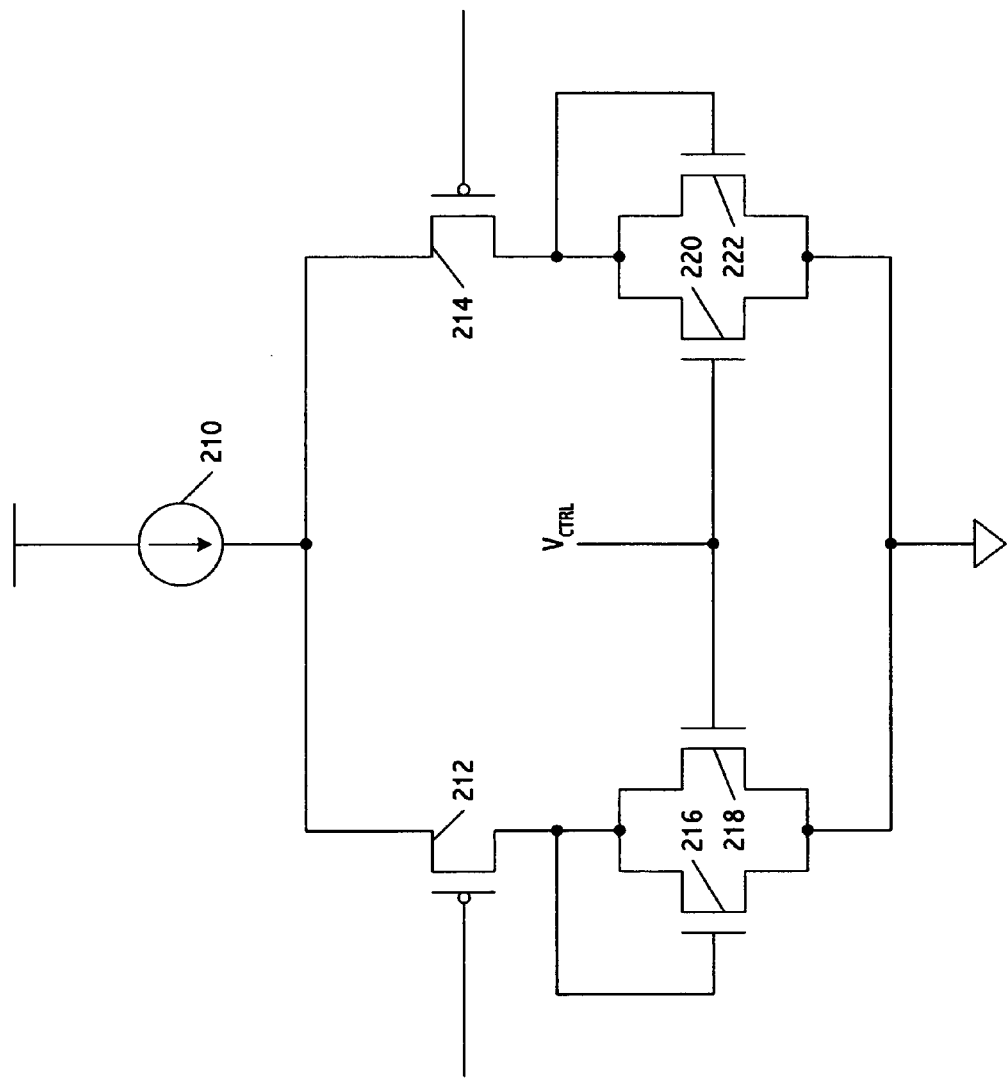
FIG. 9 is a diagram showing one type of delay cell that may be used in the DLL of FIG. 8.

FIG. 9 shows an example of how each of the delay cells in FIG. 8 may be constructed. As shown, each cell may include a current source 210, input transistors 212 and 214, a linearized resistance circuit formed from transistors 216 and 218, and a linearized resistance circuit formed from transistors 220 and 222. Control signal $V_{ctrl}$ is connected to the gates of transistors 218 and 220 for controlling the phase delay of the delay cell, and the tail current control signal $V_{TCC}$ output from differential amplifier A1 is coupled to a PMOS transistor forming the current source. Clock signals $clk_{in}$ and $\overline{clk_{in}}$ are respectively coupled to input transistors 212 and 214.

Figure 10:
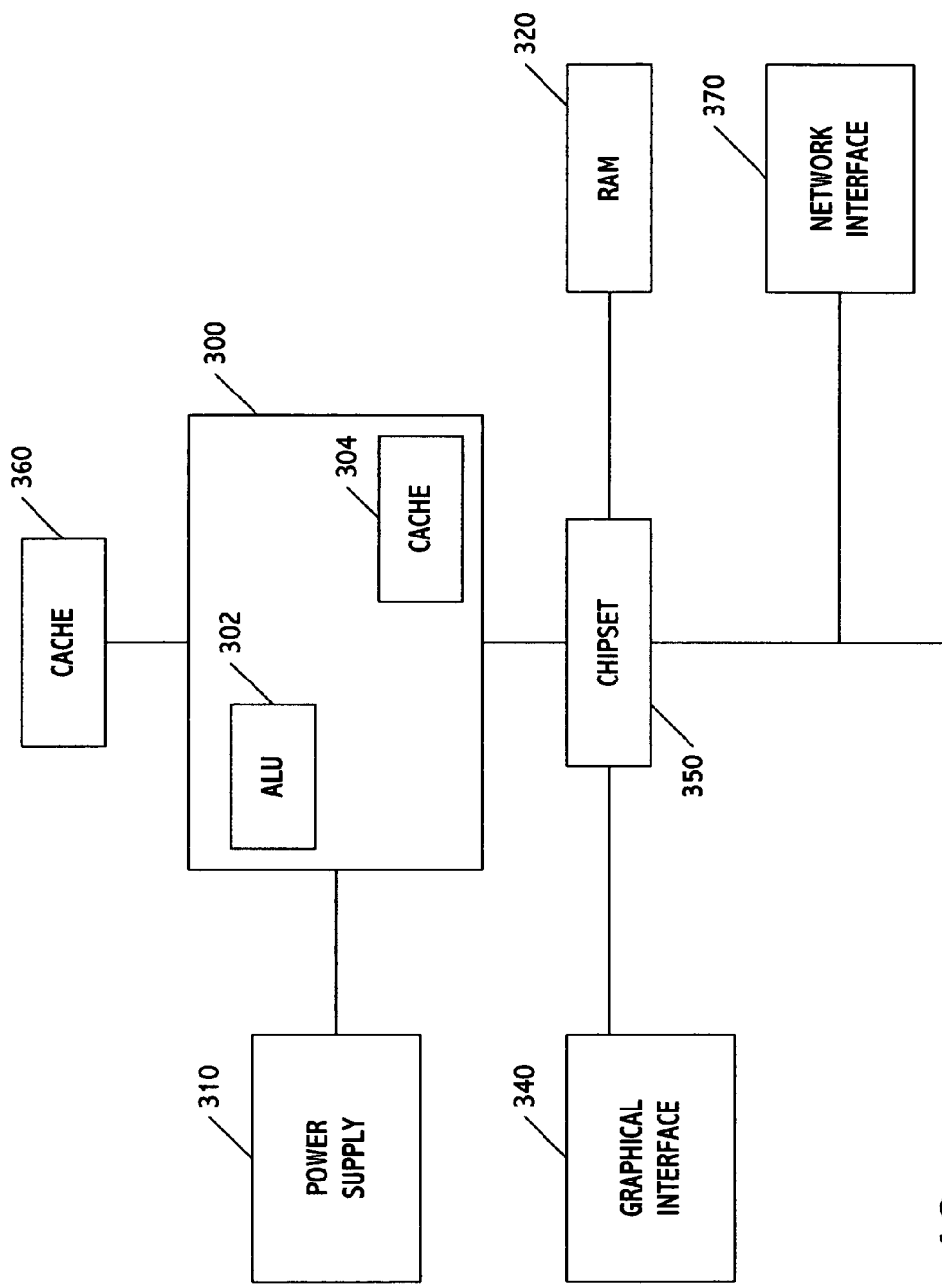
FIG. 10 is a diagram showing a processing system that may include one or more embodiments of the present invention.

FIG. 10 shows a processing system which includes a processor 300, a power supply 310, and a memory 320 which, for example, may be a random-access memory. The processor includes an arithmetic logic unit 302 and an internal cache 304. The system also preferably includes a graphical interface 340, a chipset 350, a cache 360, and a network interface 370. The processor may be a microprocessor or any other type of processor. The processor may be included on a chip die with all or any combination of the remaining features, or one or more of the remaining features may be electrically coupled to the microprocessor die through known connections and interfaces.

In FIG. 10, one or more embodiments of the present invention may be implemented to control reception of source synchronous clock signals in I/O interfaces, for example, between cache 360 and processor 300, chipset 350 and processor 300, graphical interface 340 and chipset 350, chipset 350 and memory 320, and/or chipset 350 and network interface 370.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. A controller, comprising:
   a detector to detect an amplitude of a DLL output signal; and
   a comparator to compare the amplitude of the DLL output signal to a reference signal, and to generate a tail current control signal for the DLL based on a result of the comparison, wherein the tail current control signal maintains the DLL output signal at at least a substantially constant amplitude in spite of frequency variations.

2. The controller of claim 1, wherein the reference signal is indicative of a predetermined tail current value for the DLL.

3. The controller of claim 2, wherein the tail current control signal adjusts delay of the DLL to equal the predetermined tail current value.

4. The controller of claim 1, further comprising:
   a delay cell to delay the DLL output signal input into the comparator,
   wherein the tail current control signal adjusts delays of the delay cell and the DLL.

5. A controller, comprising:
   a detector to detect an amplitude of a DLL output signal; and
   a comparator to compare the amplitude of the DLL output signal to a reference signal, and to generate a tail current control signal for the DLL based on a result of the comparison, wherein the tail current control signal adjusts voltage swing of the DLL as a function of frequency.

6. A controller, comprising:
   a detector to detect an amplitude of a DLL output signal;
   a comparator to compare the amplitude of the DLL output signal to a reference signal, and to generate a tail current control signal for the DLL based on a result of the comparison; and
   a signal generator to generate the reference signal based on a reference voltage, wherein the reference voltage is set to a value which achieves a predetermined voltage swing for the DLL.

7. A controller, comprising:
   a detector to detect an amplitude of a DLL output signal; and
   a comparator to compare the amplitude of the DLL output signal to a reference signal, and to generate a tail current control signal for the DLL based on a result of the comparison, wherein the amplitude is a peak amplitude of the DLL output signal.

8. A controller, comprising:
   a detector to detect an amplitude of a DLL output signal; and
   a comparator to compare the amplitude of the DLL output signal to a reference signal, and to generate a tail current control signal for the DLL based on a result of the comparison, wherein the detector includes:
   a power supply;
   an R-C circuit; and
   a transistor coupled between the R-C circuit and power supply and having a gate coupled to receive the DLL output signal, wherein the capacitor in the R-C circuit is charged based on voltage from the power supply when the amplitude is lower than the reference signal and is discharged through the resistor in the R-C circuit when the amplitude is higher than the reference signal, and wherein charging and discharging of the capacitor is controlled by the tail current control signal.

9. The controller of claim 8, further comprising:
   a delay cell to delay the DLL output signal,
   wherein charging or discharging of the capacitor is controlled based on an output of the delay cell, wherein the output of the delay cell is coupled to a gate of the transistor, and wherein delay of the delay cell is controlled by the tail current control signal.

10. A method, comprising:
    detecting an amplitude of a DLL output signal;
    comparing the amplitude to a reference value; and
    adjusting delay of the DLL based on a result of the comparison, wherein the reference value is indicative of a predetermined tail current value for the DLL, wherein the tail current control signal adjusts said delay to maintain the DLL output signal at at least a substantially constant amplitude in spite of frequency variations.

11. The method of claim 10, wherein adjusting delay of the DLL includes: generating a tail current control signal based on the result of the comparison.

12. The method of claim 11, further comprising:
passing the DLL output signal through a delay cell before said detecting; and
adjusting delay of the delay cell based on the tail current control signal.

13. The method of claim 11, wherein the tail current control signal adjusts delay of the DLL to equal the predetermined tail current value.

14. A method, comprising:
detecting an amplitude of a DLL output signal;
comparing the amplitude to a reference value indicative of a predetermined tail current value for the DLL; and
adjusting delay of the DLL based on a result of the comparison, wherein the amplitude is a peak amplitude of the DLL output signal.

15. A method, comprising:
detecting an amplitude of a DLL output signal;
comparing the amplitude to a reference value indicative of a predetermined tail current value for the DLL; and
adjusting delay of the DLL based on a result of the comparison, said adjusting including generating a tail current control signal based on the result of the comparison, wherein the tail current control signal adjusts voltage swing of the DLL as a function of frequency.

16. A method, comprising:
detecting an amplitude of a DLL output signal;
comparing the amplitude to a reference value indicative of a predetermined tail current value for the DLL; and
adjusting delay of the DLL based on a result of the comparison, the method further comprising adjusting voltage swing of the DLL based on a reference voltage, wherein the reference voltage controls generation of the reference value which is compared to the amplitude of the DLL output signal.

17. A system, comprising:
a circuit; and
an interface including:
a DLL,
a detector to detect an amplitude of an output signal of the DLL, and
a comparator to compare the amplitude of the DLL output signal to a reference signal and to generate a tail current control signal for the DLL based on a result of the comparison, the tail current control signal maintaining the DLL signal output at at least a substantially constant amplitude in spite of frequency variations and the DLL output signal corresponding to a clock signal for the circuit.

18. The system of claim 17, wherein the reference signal is indicative of a predetermined tall current value for the DLL.

19. The system of claim 18, wherein the tail current control signal adjusts delay of the DLL to equal the predetermined tail current value.

20. The system of claim 17, wherein the DLL output signal is a synchronous clock signal.

21. The system of claim 17, wherein the circuit is selected from the group consisting of a cache, a processor, a chipset, a memory, a network interface, and a graphical interface.

22. The system of claim 17, wherein the circuit and the interface are included on a same chip.

23. A system, comprising:
a circuit; and
an interface including:
a DLL,
a detector to detect an amplitude of an output signal of the DLL, and
a comparator to compare the amplitude of the DLL output signal to a reference signal and to generate a tail current control signal for the DLL based on a result of the comparison, wherein the DLL output signal corresponds to a clock signal for the circuit, the reference signal is indicative of a predetermined tail current value for the DLL, and the tail current control signal adjusts voltage swing of the DLL as a function of frequency.

24. A controller, comprising:
a detector to detect an amplitude of a signal from a delay cell; and
a comparator to compare the amplitude of the delay cell signal to a reference signal and to generate a control signal for the delay cell based on a result of the comparisons, the control signal maintaining the delay cell signal at a substantially constant amplitude in spite of frequency variations.

25. The controller of claim 24, wherein the delay cell is included in a delay-locked loop circuit.

26. The controller of claim 24, wherein the delay cell is coupled to an output of a delay-locked loop circuit.

27. The controller of claim 24, wherein the reference signal corresponds to a desired amplitude of the delay cell signal.

28. The controller of claim 24, wherein the control signal adjusts a delay of the delay cell to equal a predetermined tail current value that corresponds to a desired delay.

29. The controller of claim 24, wherein the delay cell is coupled to an output of a frequency generator.

30. The controller of claim 29, wherein the control signal maintains the delay cell signal at a substantially constant amplitude throughout a bandwidth that includes an operational frequency range of the frequency generator.

31. The controller of claim 29, wherein the control signal adjusts voltage swing of the DLL as a function of frequency.

32. The controller of claim 29, wherein the frequency generator is a delay-locked loop circuit.

33. A controller, comprising:
a detector to detect an amplitude of a signal from a delay cell; and
a comparator to compare the amplitude of the delay cell signal to a reference signal and to generate a control signal for the delay cell based on a result of the comparison, wherein the detector includes:
a power supply;
an R-C circuit; and
a transistor coupled between the R-C circuit and power supply and having a gate coupled to receive the delay cell signal, wherein the capacitor in the R-C circuit is charged based on voltage from the power supply when the amplitude is lower than the reference signal and is discharged through the resistor in the R-C circuit when the amplitude is higher than the reference signal, and wherein charging and discharging of the capacitor is controlled by the control signal.

34. The controller of claim 33, wherein charging or discharging of the capacitor is controlled based on the delay cell signal which is coupled to a gate of the transistor, and wherein delay of the delay cell is controlled by the control signal.

* * * * *